United States Patent
Roessler et al.

(10) Patent No.: US 10,693,456 B2
(45) Date of Patent: Jun. 23, 2020

(54) METHOD AND ELECTRONIC CIRCUIT FOR DRIVING A TRANSISTOR DEVICE

(71) Applicant: Infineon Technologies AG, Neubiberg (DE)

(72) Inventors: Werner Roessler, Neufahrn (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/194,013

(22) Filed: Nov. 16, 2018

(65) Prior Publication Data

US 2019/0158084 A1   May 23, 2019

(30) Foreign Application Priority Data

Nov. 23, 2017 (DE) .............................. 102017127752

(51) Int. Cl.
*H03K 99/00* (2013.01)
*H03K 17/687* (2006.01)
*H03K 17/567* (2006.01)
*H03K 17/06* (2006.01)

(52) U.S. Cl.
CPC ......... *H03K 17/567* (2013.01); *H03K 17/063* (2013.01); *H03K 17/687* (2013.01); *H03K 2217/0027* (2013.01); *H03K 2217/0036* (2013.01); *H03K 2217/0081* (2013.01)

(58) Field of Classification Search
CPC ............... H03K 17/567; H03K 17/687; H03K 2217/0027
See application file for complete search history.

(56) References Cited

U.S. PATENT DOCUMENTS

| 7,154,240 | B2 * | 12/2006 | Watanabe | H02P 29/027 318/434 |
| 7,403,026 | B2 * | 7/2008 | Kerber | G01R 19/175 324/750.3 |
| 7,859,812 | B2 * | 12/2010 | Chen | G05F 1/573 361/93.9 |
| 8,841,893 | B2 * | 9/2014 | Bulzacchelli | G05F 1/575 323/280 |
| 9,106,228 | B2 * | 8/2015 | Genest | H03K 17/162 |
| 9,480,193 | B2 * | 10/2016 | Vermeir | H05B 33/0887 |
| 2015/0145562 | A1 * | 5/2015 | Vermeir | H05K 13/00 327/87 |
| 2018/0062499 | A1 | 3/2018 | Yamamoto et al. | |
| 2019/0013337 | A1 * | 1/2019 | Nayak | H01L 27/1248 |

FOREIGN PATENT DOCUMENTS

DE   102014226164 A1   6/2016
DE   112015006836 T5   5/2018

OTHER PUBLICATIONS

Office Action, in the German language, from counterpart German Application No. 102017127752.8, dated Oct. 8, 2018, 6 pp.

* cited by examiner

*Primary Examiner* — Dinh T Le
(74) *Attorney, Agent, or Firm* — Shumaker & Sieffert, P.A.

(57) ABSTRACT

A method and an electronic circuit are disclosed. The method includes driving a transistor device in an on-state by applying a drive voltage higher than a threshold voltage of the transistor device to a drive input, and adjusting a voltage level of the drive voltage based on a load signal that represents a current level of a load current through the transistor device, wherein the current level is an actual current level or an expected current level of the load current.

20 Claims, 9 Drawing Sheets

METHOD AND ELECTRONIC CIRCUIT FOR DRIVING A TRANSISTOR DEVICE

This Application claims priority to German Application Number 102017127752.8, filed on Nov. 23, 2017, the entire content of which is incorporated herein by reference.

This disclosure in general relates to a method and an electronic circuit for driving a transistor device.

Voltage controlled transistor devices such as MOSFETs (Metal Oxide Semiconductor Field-Effect-Transistor) or IGBTs (Insulated Gate Bipolar Transistors) are widely used as electronic switches in various types of applications. Conduction losses that occur in an on-state of the transistor device are dependent on an on-resistance of the transistor device and a load current flowing through the transistor device. The "on-resistance" is the electrical resistance of the transistor device in the on-state. The conduction losses are proportional to the on-resistance and the square of the load current. In high current applications such as electric vehicles, where load currents of several hundred amperes may occur, such conduction losses can be considerable. There is therefore a need to reduce the conduction losses.

One example relates to a method. The method includes driving a transistor device in an on-state by applying a drive voltage higher than a threshold voltage of the transistor device to a drive input, and adjusting a voltage level of the drive voltage based on a load signal that represents a current level of a load current through the transistor device. The current level is an actual current level or an expected current level of the load current.

Another example relates to an electronic circuit with a drive circuit. The drive circuit is configured to generate a drive voltage higher than a threshold voltage of a transistor device at a drive output configured to have a drive input of the transistor device connected thereto, and adjust a voltage level of the drive voltage based on a load signal that represents a current level of a load current through the transistor device. The current level is an actual current level or an expected current level of the load current.

Examples are explained below with reference to the drawings. The drawings serve to illustrate certain principles, so that only aspects necessary for understanding these principles are illustrated. The drawings are not to scale. In the drawings the same reference characters denote like features.

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
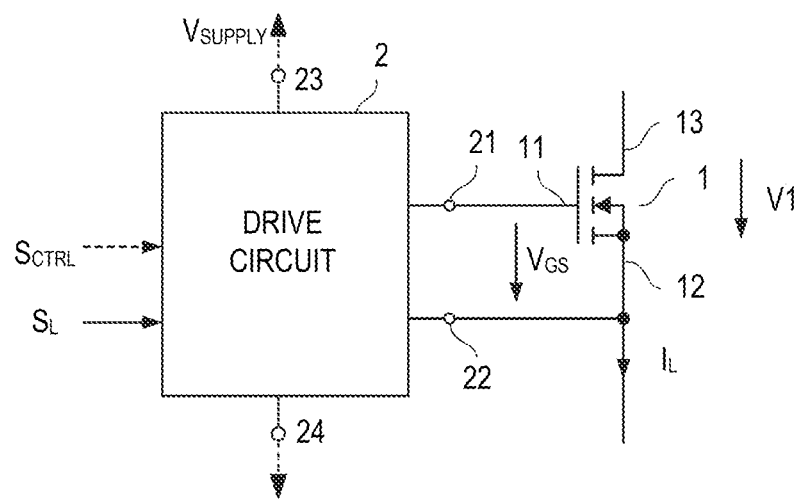
FIG. 1 shows one example of an electronic circuit including a transistor device and a drive circuit configured to drive the transistor device.

FIG. 1 shows one example of an electronic circuit that includes a transistor device 1 and a drive circuit 2 configured to drive the transistor device 1. The transistor device 1 is a voltage controlled transistor device that is configured to switch on or off dependent on a drive voltage $V_{GS}$ received at a drive input of the transistor device 1. The transistor device 1 switches on (enters an on-state) when the drive voltage $V_{GS}$ exceeds a threshold voltage (which is referred to as $V_{th}$ in the following) and switches off (enters an off-state) when the drive voltage $V_{GS}$ falls below the threshold voltage $V_{th}$. The transistor device 1 includes a control node 11 and a load path between a first load node 12 and a second load node 13. In the example shown in FIG. 1, the drive input of the transistor device 1 includes the control node 11 and the first load node 12, that is, the drive voltage $V_{GS}$ is received by the transistor device 1 between the control node 11 and the first load node 12. This, however, is only an example. According to another example (not shown) the drive input includes the control node of the transistor device and a further node separate from the first load node and the second load node of the transistor device.

Just for the purpose of illustration, the transistor device 1 shown in FIG. 1 is a MOSFET, more specifically, a n-type. A gate node of this MOSFET forms the control node 11, a source node forms the first load node 12, and a drain node forms the second load node 13. According to one example, the MOSFET 1 is a silicon (Si) based MOSFET. That is, the MOSFET is fabricated based on monocrystalline silicon. According to another example, the MOSFET is a silicon carbide (SiC) based MOSFET. In this example, the MOSFET is manufactured based on monocrystalline silicon carbide. Implementing the transistor device as an n-type MOSFET is only an example. According to another example, the transistor device 1 is implemented as a p-type MOSFET, according to yet another example, the transistor device is implemented as an IGBT. According to one example, the transistor device 1 has a voltage blocking capability of several hundred volts. According to one example, the voltage blocking capability is higher than 400 V, higher than 600 V, or higher than 800 V. The "voltage blocking capability" is defined as the voltage level of a load voltage between the second load node 13 and the first load node 12 that the transistor device 1 can withstand in the off-state without being damaged or destroyed.

Referring to FIG. 1, the drive circuit 2 includes a drive output configured to be connected to the drive input 11, 12 of the transistor device 1 and to provide the drive voltage $V_{GS}$. In this example, the drive output includes a first output node 21 configured to be coupled to the control node 11 and a second output node 22 configured to be coupled to the second load node 12 (or an equivalent circuit node of the transistor device 1). The drive circuit 2 is configured to drive the transistor device 1, either in the on-state by generating the drive voltage $V_{GS}$ with a voltage level higher than the threshold voltage $V_{th}$, or in the off-state by generating the drive voltage $V_{GS}$ with a voltage level lower than the threshold voltage $V_{th}$. Whether the drive circuit 2 drives the transistor device 1 in the on-state or in the off-state can be dependent on various parameters. According to one example (illustrated in dashed lines in FIG. 1) the drive circuit 2 receives a control signal $S_{CTRL}$ and operates the transistor device 1 in the on-state or in the off-state dependent on the control signal $S_{CTRL}$. According to another example, the drive circuit 2 operates the transistor device 1 in the on-state whenever a supply voltage $V_{SUPPLY}$ received at supply nodes 23, 24 (illustrated in dashed lines in FIG. 1) exceeds a predefined voltage level. The supply voltage $V_{SUPPLY}$ is used in the drive circuit to generate the drive voltage $V_{GS}$.

Figure 2:
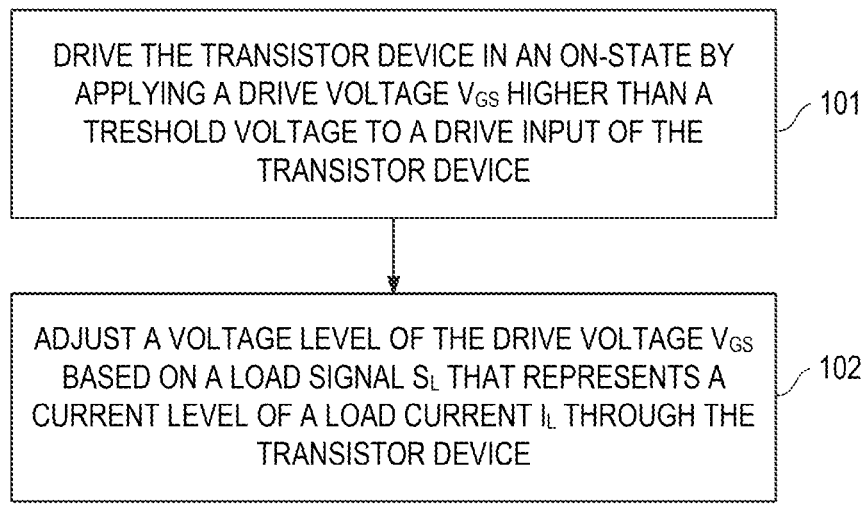
FIG. 2 shows a flowchart that illustrates one example of a method for driving the transistor device in an on-state.

Independent of how the drive circuit is triggered to operate the transistor device 1 in the on-state, referring to FIG. 2, driving the transistor device 1 in the on-state includes applying the drive voltage $V_{GS}$ at the drive input 11, 12 with a voltage level higher than the threshold voltage $V_{th}$ of the transistor device 1 (101 in FIG. 2), and adjusting the voltage level of the drive voltage based on a load signal $S_L$ (102 in FIG. 2). In the electronic circuit shown in FIG. 1, the load signal $S_L$ is received by the drive circuit 2. The load signal $S_L$ represents a current level of a load current $I_L$ through the transistor device 1. This current level may be an actual current level, that is, a current level of an instantaneous current $I_L$ flowing through the transistor device 1. According to another example, the load signal Si, represents an expected current level of the load current $I_L$. In this example, the voltage level of the drive voltage $V_{GS}$ may already be adjusted before the current level of the load current $I_L$ changes. Examples of how the load signal $S_L$ can be generated are explained herein further below.

Figure 3:
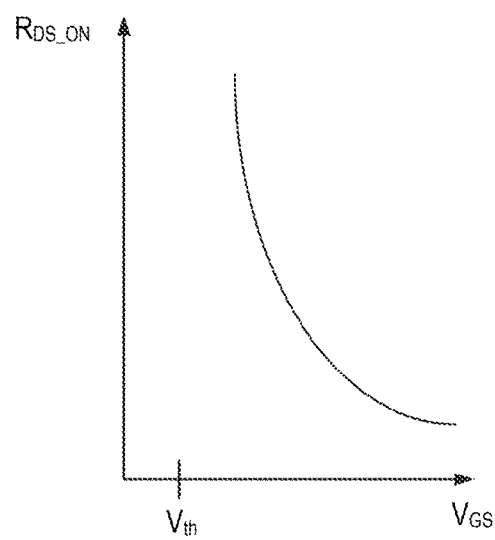
FIG. 3 is a graph that illustrates a dependency of an on-resistance of the transistor device on a drive voltage received at a drive input of the transistor device.

According to one example, driving the transistor device 1 in the on-state includes driving the transistor device in the on-state for more than one second (1 s), more than one minute, more than ten minutes, more than one hour (1 h), or even more than one day (1 d). In particular, adjusting the voltage level of the drive voltage based on the load signal $S_L$ includes increasing the voltage level of the drive voltage $V_{GS}$ when the load signal $S_L$ indicates that the load current has increased or will increase. Such increasing of the drive voltage $V_{GS}$ in the on-state when the load current $I_L$ increases can help to reduce conduction losses occurring in the transistor device 1. These conduction losses, in the case of a unipolar transistor such as, e. g., a MOSFET, are essentially given by $$P_C = R_{DS\_ON} \cdot I_L^2 \quad (1),$$

where $P_C$ denotes the conduction losses, $R_{DS\_ON}$ denotes an on-resistance of the transistor device 1, and $I_L$ denotes the load current. As can be seen from equation (1), the conduction losses $P_C$ are proportional to the on-resistance $R_{DS\_ON}$ of the transistor device 1 and proportional to the square of the load current. The "on-resistance" of the transistor device 1 is the electrical resistance of the transistor device 1 in the on-state. This on-resistance $R_{DS\_ON}$ is dependent on the drive voltage $V_{GS}$ and, within a given range of the drive voltage $V_{GS}$, decreases as the drive voltage $V_{GS}$ increases. This is schematically illustrated in FIG. 3, which shows a graph that illustrates a dependency of the on-resistance $R_{DS\_ON}$ the drive voltage $V_{GS}$. FIG. 3 illustrates the on-resistance $R_{DS\_ON}$ over the drive voltage $V_{GS}$ in a voltage range of the drive voltage $V_{GS}$ that is higher than the threshold voltage $V_{th}$. As can be seen from FIG. 3, there is a range of the drive voltage $V_{GS}$ in which the on-resistance $R_{DS\_ON}$ decreases as the drive voltage $V_{GS}$ increases.

Increasing the drive voltage $V_{GS}$, however, may reduce the statistical lifetime or increase the failure rate. Each voltage level of the drive voltage $V_{GS}$ is associated with a statistical lifetime and a failure rate. That is, the probability that a transistor device will fail within the statistical lifetime is given by the failure rate. In other words, in a plurality of samples, a percentage of these, given by the failure rate, will fail within the statistical lifetime. For example, the probability that the transistor device 1 will fail within a pre-defined time period (statistical lifetime) T1 when operated with a drive voltage having a first voltage level $V_{GS1}$ is p1. Operating the transistor device with the drive voltage having a second voltage level $V_{GS2}$ higher than the first voltage level $V_{GS1}$ may increase the failure rate. That is, a probability p2 that the transistor device 1, when operated with the higher drive voltage $V_{GS2}$, will fail within the first time period T1 is higher than the first probability p1. This is equivalent to a reduction of the statistical lifetime. That is, a time period T2 for which the transistor device 1 can be operated in the on-state at the higher gate voltage $V_{GS2}$ and has first probability p1 of failing is shorter than the first time period T1. For this reason, it may be undesirable to permanently operate the transistor device 1 at a high drive voltage such as the higher voltage $V_{GS2}$.

Figure 4:
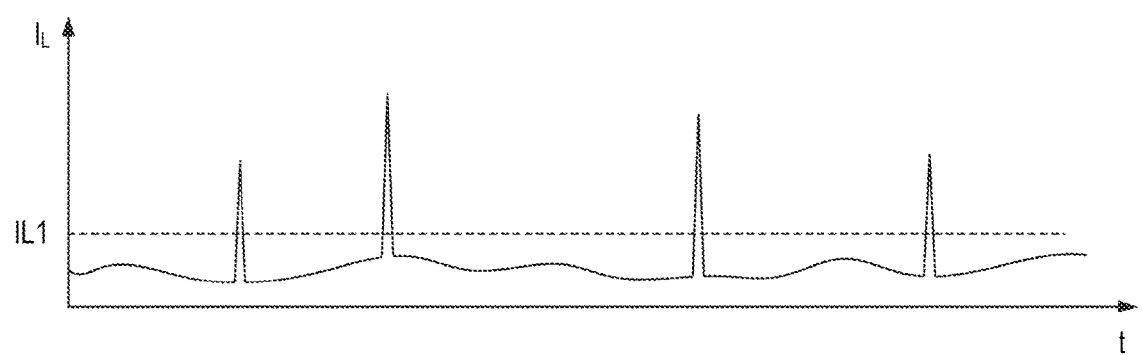
FIG. 4 shows one example of a timing diagram of a load current through the transistor device.

However, in many applications high load current peaks that may require an increase of the drive voltage $V_{GS}$ in order to at least partially counteract an increase of the conduction losses are relatively short as compared to an overall duration of the on-state. This is schematically illustrated in FIG. 4 that shows a timing diagram of the load current $I_L$. In this example, the load current $I_L$ is below a certain current level IL1 for most of the time. Nevertheless, there are several current peaks that exceed this current level IL1. A signal waveform of the type shown in FIG. 4 is the typical waveform of an overall current flowing into a motor of an electric vehicle. The time periods with the current peaks represent those time periods in which the vehicle accelerates.

Referring to equation (1), the conduction losses increase proportionally to the square of the load current. The conduction losses are associated with a heating of the transistor device 1. In order to avoid overheating, the transistor device 1 may including cooling means (not shown in the drawings) such as, for example, a heat conducting carrier. Dimensions of this cooling system may be designed such that the cooling system is capable of handling dissipated power that occurs when the load current is at a maximum level, as may occur during the current peaks shown in FIG. 4, although these current peaks may not be of a long duration. An increase of the dissipated power may increase the temperature of the transistor device 1, wherein such increase of the temperature may result in an increase of the on-resistance which, in turn, further increases the dissipated power. Thus, a kind of positive feedback takes place. Increasing the gate-source voltage $V_{GS}$ when the load current increases reduces the on-resistance. This may help to avoid or at least reduce an increase of the dissipated power, so as to avoid or reduce the positive feedback described above.

The voltage level of the drive voltage $V_{GS}$ may be varied based on the load signal $S_L$ in various ways. Some examples are explained with reference to FIGS. 5, 6 and 7 herein below. Each of these figures illustrates the drive voltage $V_{GS}$ over the load signal $S_L$ in the on-state of the transistor device. In each of these examples, the voltage level of the drive voltage $V_{GS}$ is selected from an interval that ranges from a minimum level $V_{GS\_MIN}$ to a maximum level $V_{GS\_MAX}$.

In the example shown in FIG. 5, only two different voltage levels are used to drive the transistor device 1 in the on-state, the minimum level $V_{GS\_MIN}$, when the load signal $S_L$ is below a first threshold $S_{L1}$, and the maximum level $V_{GS\_MAX}$, when the load signal $S_L$ exceeds the first level $S_{L1}$. Optionally, changing the voltage level based on the load signal $S_L$ includes a hysteresis, so that the drive voltage $V_{GS}$ increases from the minimum level $V_{GS\_MIN}$ to the maximum level $V_{GS\_MAX}$ when the load signal $S_L$ exceeds the first threshold $S_{L1}$, and the drive voltage $V_{GS}$ changes from the maximum level $V_{GS\_MAX}$ back to the minimum level $V_{GS\_MIN}$ when the load signal $S_L$ falls below a threshold $S_{L1}'$, that is, lower than the first threshold $S_{L1}$.

According to one example, the minimum level $V_{GS\_MIN}$ and the maximum level $V_{GS\_MIN}$ are such that the statistical lifetime of the transistor device 1 associated with the maximum level $V_{GS\_MAX}$ is shorter than a statistical lifetime associated with the minimum level $V_{GS\_MIN}$. Referring to the above, the statistical lifetime is associated with a given failure rate, that is, the statistical lifetime is the time period in which, from a plurality of samples of transistor devices of the same type, a percentage, given by the given failure rate, will fail. According to one example, the given failure rate associated with the statistical lifetime is less than $10^{-2}$ (1%), less than $10^{-3}$ (0.1%), less than $10^{-4}$, less than $10^{-5}$, less than $10^{-6}$ (1 ppm, part per million), or even below. According to one example, the minimum level $V_{GS\_MIN}$ is selected such that the statistical lifetime (associated with the given failure rate) is more than 10 years, more than 50 years, or more than 100 years. In the following, $T_L(V_{GS\_MIN}, p_{FAILURE})$ denotes the statistical lifetime associated with the minimum gate-source voltage $V_{GS\_MIN}$ (that is, when the transistor device 1 is operated with the minimum gate-source voltage $V_{GS\_MIN}$) and the given failure rate $p_{FAILURE}$. According to one example, the maximum level $V_{GS\_MAX}$ of the gate-source voltage is such that a statistical lifetime $T_L(V_{GS\_MAX}, p_{FAILURE})$ associated with the maximum level $V_{GS\_MAX}$ and the given failure rate $p_{FAILURE}$ is less than the statistical lifetime $T_L(V_{GS\_MIN}, p_{FAILURE})$ associated with the minimum level, that is, $$T_L(V_{GS\_MAX}, p_{FAILURE}) = c \cdot T_L(V_{GS\_MIN}, p_{FAILURE}) \quad (2),$$

where c is a constant smaller than 1 (c<1). According to one example, the failure rate $p_{FAILURE}$ is selected from between $10^{-2}$ and $10^{-6}$ and maximum level $V_{GS\_MAX}$ is such that c is less than 0.1 ($10^{-1}$), less than 0.01 ($10^{-2}$), or even less than 0.001 ($10^{-3}$). The statistical lifetime $T_L(V_{GS\_MAX}, p_{FAILURE})$ associated with the maximum level $V_{GS\_MAX}$ may reach or may be even lower than an expected operational lifetime of an application in which the transistor device is employed. However, due to the short time duration for which the maximum level $V_{GS\_MAX}$ needs to be applied to the transistor device 1, this significantly lower statistical lifetime associated with the maximum level should not cause the transistor device to fail within the expected operational lifetime of the application.

Figure 5:
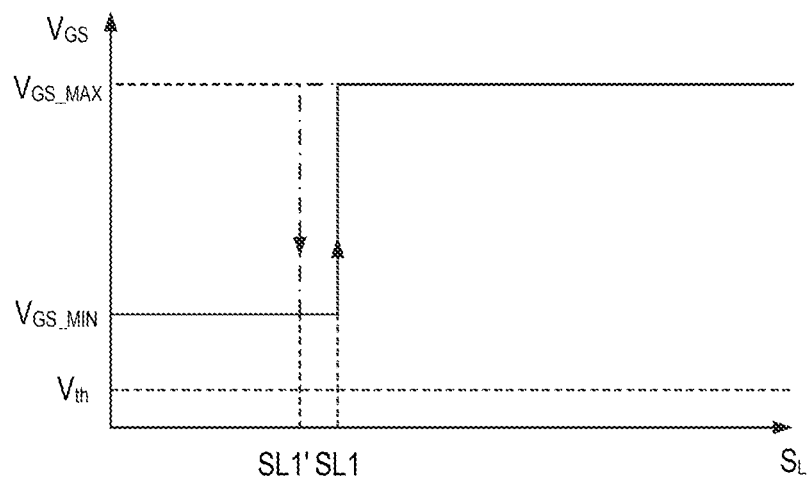
FIG. 5 illustrates one example of adjusting a voltage level of the drive voltage dependent on a load signal.
Figure 6:
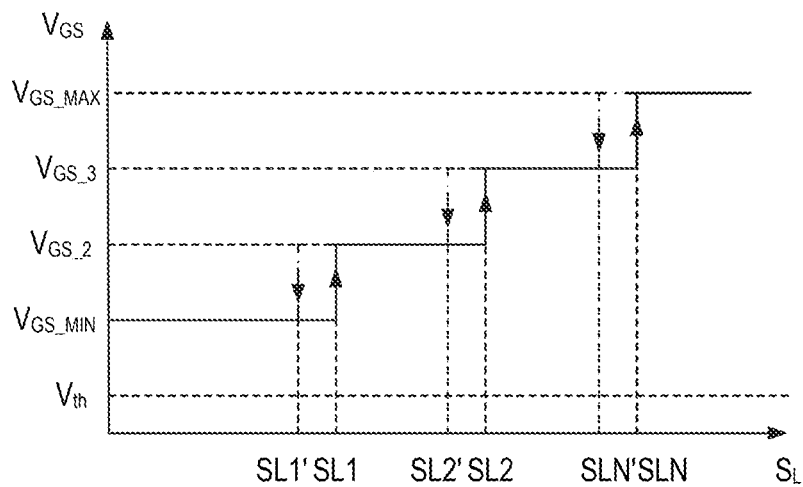
FIG. 6 illustrates another example of adjusting a voltage level of the drive voltage dependent on a load signal.

FIG. 6 shows a modification of the example shown in FIG. 5. In the example shown in FIG. 6, the load signal $S_L$ is not compared with only one threshold $S_{L1}$, as shown in FIG. 5, but is compared with N thresholds, where N is an integer greater than one (N>1), and the transistor device is driven using one of N+1 different voltage levels based on comparing the load signal $S_L$ with theses N thresholds. Just for the purpose of explanation, N=3 in the example shown in FIG. 6. In this example, the drive voltage $V_{GS}$ has a first level, which is the minimum level $V_{GS\_MIN}$ in this example, when the load signal $S_L$ is below a first threshold $S_{L1}$. Further, the drive voltage $V_{GS}$ has a second level $V_{GS\_2}$ when the load signal $S_L$ is between the first level $S_{L1}$ and a second level $S_{L2}$, a third level $V_{GS\_3}$ when the load signal $S_L$ is between the second level $S_{L2}$ and a third level (the N-th level in this example), and a fourth level ((N+1)-th level) when the load signal $S_L$ exceeds the third level $S_{LN}$. The fourth level corresponds to the maximum level $V_{GS\_MAX}$ in this example. As in the example shown in FIG. 5, the drive voltage $V_{GS}$ may change between the individual voltage levels in accordance with hysteresis curves. That is, the drive voltage $V_{GS}$ may change from the second level $V_{GS\_2}$ back to the first level $V_{GS\_MIN}$ when the load signal $S_L$ falls below a threshold lower than the first threshold $S_{L1}$, the driver voltage $V_{GS}$ may change from the third level $V_{GS\_3}$ back to the second level $V_{GS\_2}$ when the load signal $S_L$ falls below a threshold $S_{L2}'$ lower than the second threshold $S_{L2}$, and so on. Further, SL1<SL2<SL3<SLN and $V_{GS\_MIN}<V_{GS\_2}<V_{GS\_3}<V_{GS\_MAX}$.

Figure 7:
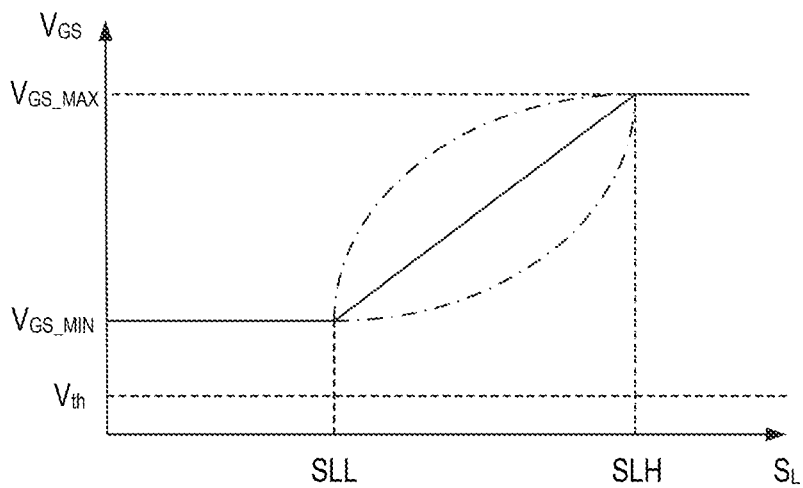
FIG. 7 illustrates yet another example of adjusting a voltage level of the drive voltage dependent on a load signal.

In the example shown in FIG. 7, the voltage level of the gate voltage $V_{GS}$ continuously increases between the minimum level $V_{GS\_MIN}$ and the maximum level $V_{GS\_MAX}$ when the load signal $S_L$ is between a lower threshold $S_{LL}$ and an upper threshold $S_{LH}$. When the load signal $S_L$ is below the lower threshold $S_{LL}$, the drive voltage $V_{GS}$ has the minimum level $V_{GS\_MIN}$, and when the load signal $S_L$ is higher than the upper threshold $S_{LH}$ the drive voltage $V_{GS}$ has the maximum level $V_{GS\_MAX}$. In the example shown in FIG. 7, the voltage level of the drive voltage $V_{GS}$ linearly increases as the load signal $S_L$ increases between the lower level $S_{LL}$ and the upper level $S_{LH}$. This, however, is only an example. The voltage level of the drive voltage $V_{GS}$ may increase in any other way as well. Further examples of how the drive voltage $V_{GS}$ may increase based on the load signal are illustrated in dashed and dotted lines in FIG. 7.

Figure 8:
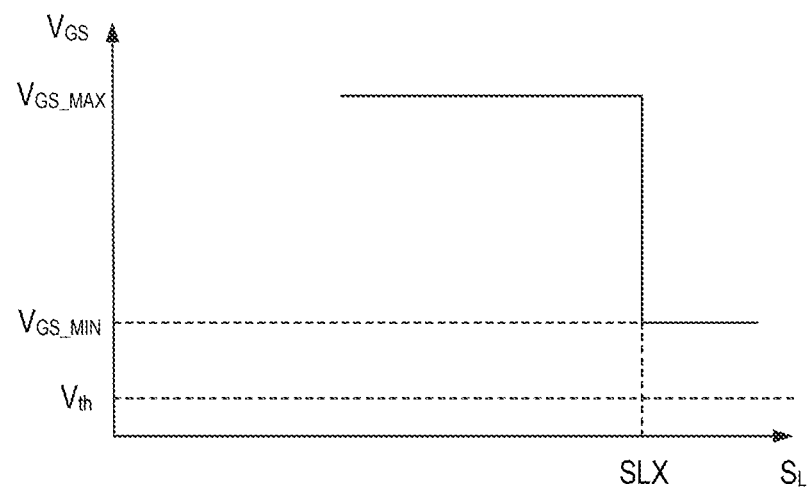
FIG. 8 illustrates one example of adjusting the drive voltage when the load signal exceeds a maximum threshold.

According to one example illustrated in FIG. 8, the voltage level of the drive voltage $V_{GS}$ may be reduced to the minimum level $V_{GS\_MIN}$ when the load signal $S_L$ exceeds a predefined maximum level $S_{LX}$. This change of the drive voltage $V_{GS}$ to the minimum level $V_{GS\_MIN}$ is independent of how the drive voltage $V_{GS}$ may have increased to the maximum level $V_{GS\_MAX}$. The drive scheme illustrated in FIG. 8 may therefore be combined with any of the drive schemes explained with reference to FIGS. 5, 6 and 7.

Referring to the above, the load signal $S_L$ represents a current level of the load current $I_L$, wherein the load signal $S_L$ may represent an instantaneous current level of the load current $I_L$ or an expected current level of the load current. Examples of how the load signal $S_L$ may be generated are explained with reference to FIGS. 9, 10 and 11 below.

Figure 9:
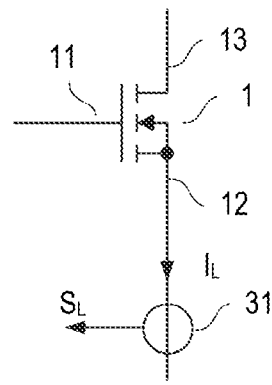
FIG. 9 illustrates obtaining the load signal based on measuring the load current.

According to one example shown in FIG. 9, generating the load signal $S_L$ includes measuring the load current $I_L$ using a current sensor 31. The current sensor 31 can be any type of current sensor suitable for measuring the load current $I_L$ flowing through the transistor device 1. The current sensor 31 is, for example, a current sensor integrated in the transistor device 1, a current sensor having a shunt resistor connected in series with the load path of the transistor device 1, a current sensor including a magnetic sensor like a Hall sensor or a sensor using magneto-resistive effects, an inductive current sensor, or the like. According to one example, the load signal $S_L$ generated by the current sensor 31 is monotonic dependent or even proportional to the load current $I_L$.

Figure 10:
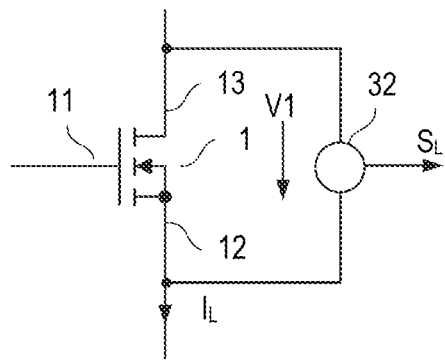
FIG. 10 illustrates obtaining the load signal based on measuring a voltage across a load path of the transistor device.

According to another example shown in FIG. 10, generating the load signal $S_L$ includes measuring a load path voltage V1 (which, in a MOSFET, is usually referred to as drain-source voltage) using a voltage sensor. Any type of voltage sensor suitable for measuring the load path voltage can be used. The load path voltage V1 does not directly represent the load current $I_L$ but is given by the on-resistance $R_{ON\_DS}$ multiplied with the load current $I_L$, $V1=R_{DS\_ON} \cdot I_L$. Nevertheless, the load path voltage V1 indicates when the load current $I_L$ increases because such an increase of the load current $I_L$ results in a corresponding increase of the load path voltage V1. As the on-resistance $R_{ON\_DS}$ increases as the temperature increases, e. g., due to higher power dissipation in the transistor device, generating the load signal $S_L$ based on the load path voltage V1 also helps to reduce losses and thus reduce the operating temperature of the transistor device 1. Generating the load signal $S_L$ based on the load path voltage may, in particular, be used in connection with a method that adjusts two or more discrete voltage levels of the drive voltage $V_{GS}$. Examples of such methods are illustrated in FIGS. 5 and 6.

Figure 11:
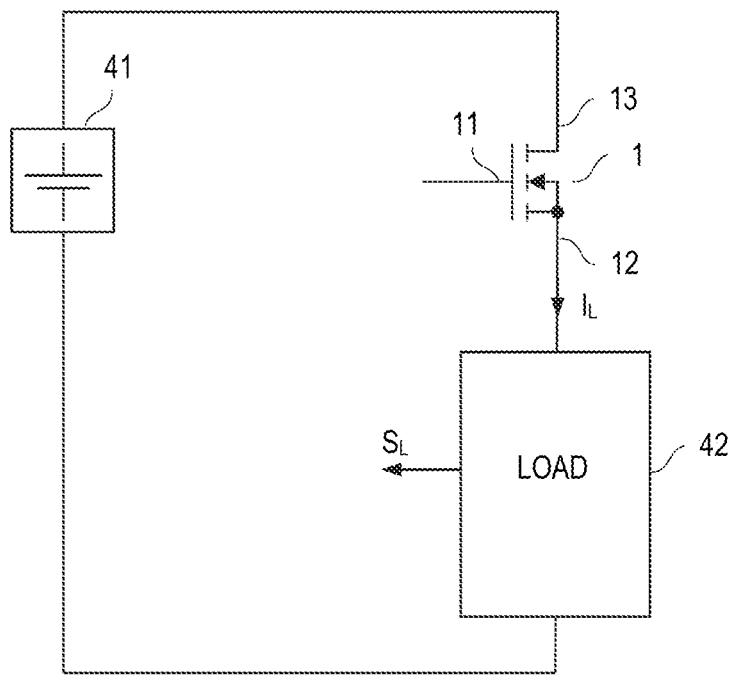
FIG. 11 illustrates one example in which the load signal is obtained from a load connected in series with the transistor device.

According to another example shown in FIG. 11, the load signal $S_L$ is provided by a load 42 connected in series with the load path 12-13 of the transistor device 1. In this example, a series circuit with the transistor device 1 and the load is connected to a DC (direct current) power source such as a battery. The load 42 can be any type of electrical load and may include further transistor devices. According to one example, the load 42 includes an electrical motor and an inverter configured to drive the motor using a DC voltage V41 received from the DC power source 41 via the transistor device 1. In the circuit shown in FIG. 11, the transistor device 1 may act as a battery switch which only serves to connect the load 42 to the battery 41 or to disconnect the load 42 from the battery 41. The load current $I_L$ is only defined by the operation of the load 42. That is, dependent on an operating state of the load 42, the load current $I_L$, in the on-state of the transistor device 1, may vary within a great range. The load current $I_L$ may vary, for example, from between 0 A and several 100 A. The load signal $S_L$ may be generated by a controller inside the load 42, wherein this controller is configured to control operation of the load 42. When the load 42 includes a motor of a vehicle, for example, the controller may accelerate the motor based on a corresponding signal received from an accelerator pedal. Upon receipt of a signal indicating that it is desired to accelerate the motor, the controller may change the load signal $S_L$ transmitted to the drive circuit 2 before the controller accelerates the motor.

Figure 12:
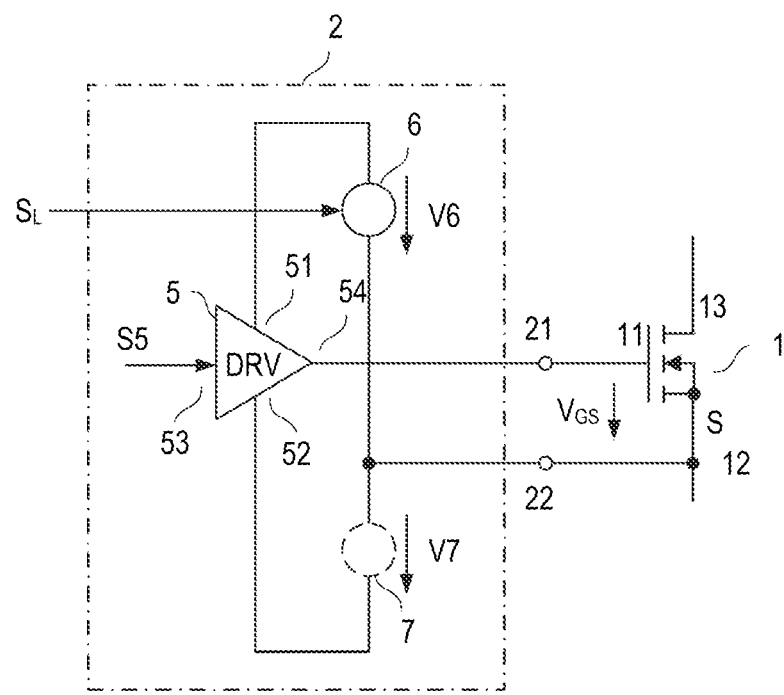
FIG. 12 shows one example of the drive circuit.

FIG. 12 shows one example of the drive circuit 2 in greater detail. In this example, the drive circuit 2 includes an adjustable voltage source 6 that receives the load signal $S_L$ and is configured to generate a variable first voltage V6 based on the load signal $S_L$. The first voltage source 6 is connected between the second output node 22 and a first input 51 of a driver 5. A second input 52 of the driver 5 is connected to the second output node 22 directly or via an optional second voltage source 7. The optional second voltage source 7 is configured to generate a second voltage V7. An output 54 of the driver 5 is connected to the first output node 21. In order to drive the transistor device 1 in the on-state, the driver 5 connects the voltage source 6 to the first output node 21 so that the drive voltage $V_{GS}$ received by the transistor device 1 essentially equals the first voltage V6 provided by the first voltage source 6. In this example, the drive voltage $V_{GS}$ can be adjusted by adjusting the voltage V6 based on the node signal $S_L$. To switch off the transistor device 1, the driver 5 internally connects its second input 52 with the first output node 21. In this case, the drive voltage $V_{GS}$ is zero when second voltage source 7 is omitted, or essentially equals the inverted second voltage −V7. Whether the driver 5 drives the transistor device 1 in the on-state or the off-state is dependent on a drive signal S5 received at a drive input 53 of the driver 5. This drive signal S5 may be any type of signal indicating that it is desired to switch on or switch off the transistor device 1. According to one example, this drive signal S5 equals the control signal $S_{CTRL}$ explained with reference to FIG. 1 or is based on this control signal $S_{CTRL}$. According to another example, the drive signal S5 is dependent on a supply voltage $V_{SUPPLY}$ received by the drive circuit 2 between supply nodes 23, 24 explained with reference to FIG. 1.

Figure 13:
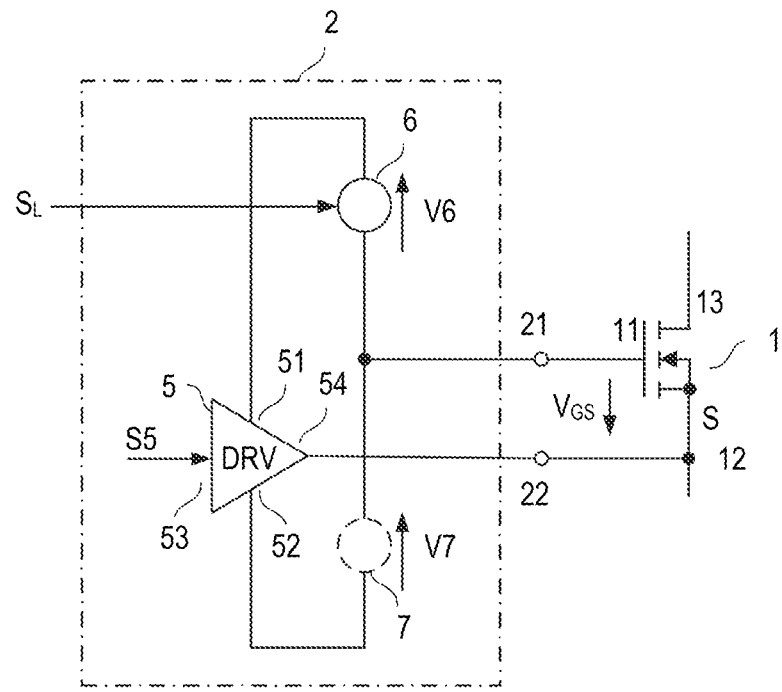
FIG. 13 shows another example of the drive circuit.

FIG. 13 shows a drive circuit according to another example. The drive circuit 2 shown in FIG. 13 is different from the drive circuit 2 shown in FIG. 12 in that the output 54 of the driver is connected to second output node 22 instead of the first output node 21. Further, the voltage source 6 is connected between the first output node 21 and the first input 51 of the driver 5. The second input 52 of the driver 5 is connected to the first output node 21, either directly or via the optional second voltage source V7.

Figure 14:
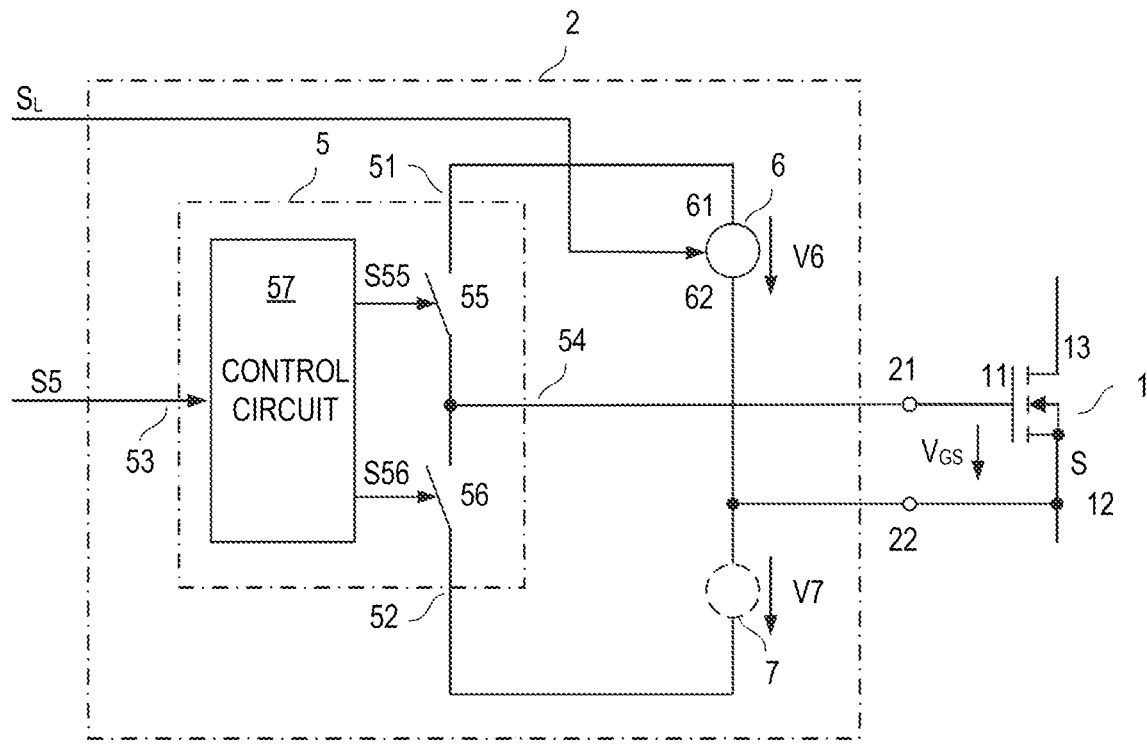
FIG. 14 shows one example of a driver included in the drive circuits illustrated in FIGS. 12 and 13.

FIG. 14 shows one example of the driver 5 in greater detail. For explanation purposes, the first voltage source 6, the optional second voltage source 7, and the transistor 1 are also illustrated in FIG. 14. Just for the purpose of illustration, the driver 5 and the voltage sources 6, 7 are connected as shown in FIG. 12. Nevertheless, the driver 5 shown in FIG. 15 may be used in a configuration as shown in FIG. 13 as well.

Referring to FIG. 14, the driver 5 includes a first switch 55 connected between the first input 51 and the first output 55, and a second switch 56 connected between the second input 52 and the output 54. A control circuit 57 generates control signals S55, S56 received by the switches 55, 56, wherein the switches 55, 56 switch on or off dependent on these control signals S55, S56. The control circuit 57 generates the control signals S55, S56 based on the drive signal S5. Whenever the drive signal S5 indicates that it is desired to switch on the transistor device 1, the control circuit 57 generates the control signals S55, S56 such that the first switch 55 switches on and the second switch 56 switches off, so that the first voltage source 6 is connected between the first output node 21 and the second output node 22. When the drive signal S5 indicates that it is desired to switch off the transistor device 1, the control circuit 57 generates the control signals S55, S56 such that the first switch 55 switches off and the second switch 56 switches on, so that the drive voltage $V_{GS}$ is either zero or −V7. Any type of electronic switch, such as any type of transistor, may be used to implement the first switch 55 and the second switch 56.

The adjustable first voltage source 6 may be implemented in various ways. Examples of how the first voltage source 6 may be implemented are explained with reference to FIGS. 15 and 16 below.

Figure 15:
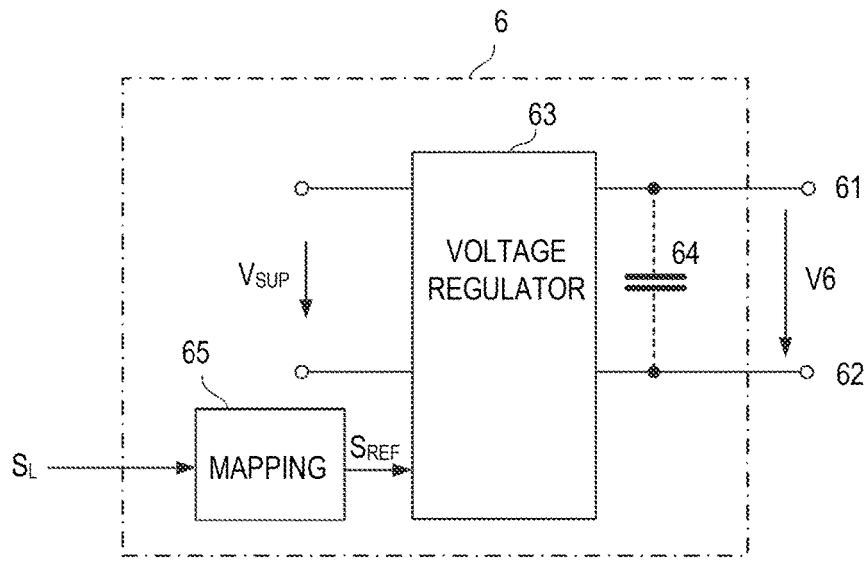
FIG. 15 shows one example of an adjustable voltage source.

According to FIG. 15, the voltage source 6 may include a voltage regulator 63 that receives a supply voltage $V_{SUP}$ and is configured to generate the first voltage V6 between output nodes 61, 62 of the first voltage source 6 based on the supply voltage $V_{SUP}$. The supply voltage $V_{SUP}$ received by the voltage regulator 63 may be the supply voltage $V_{SUPPLY}$ received by the supply nodes 23, 24 of the drive circuit 2 (see FIG. 1) or may be a supply voltage $V_{SUP}$ generated based on this supply voltage $V_{SUPPLY}$ received by the drive circuit 2. The voltage regulator 63 receives a reference signal $S_{REF}$ that defines the voltage level of the output voltage V6 generated by the voltage regulator 63 based on the supply voltage $V_{SUP}$. Optionally, an output capacitor 64 is coupled between the output nodes 61, 62. A mapping circuit 65 generates the reference signal $S_{REF}$ based on the load signal $S_L$. That is, the mapping circuit 65 maps the load signal $S_L$ on the reference signal $S_{REF}$, wherein the voltage regulator 63 generates the first voltage V6 based on the reference signal $S_{REF}$ and wherein, in the on-state of the transistor device 1, the drive voltage $V_{GS}$ equals the first voltage V6. The mapping circuit 65 may map the load signal $S_L$ on the reference signal $S_{REF}$ based on any of the examples explained with reference to FIGS. 5 to 7. That is, the mapping circuit 65 may generate only two different signal levels of the reference signal $S_{REF}$ based on the node signal $S_L$ in order to achieve only two different voltage levels of the drive voltage $V_{GS}$. Or the mapping circuit 65 may generate several discrete signal levels of the reference signal $S_{REF}$ based on the load signal $S_L$ in order to achieve more than two different voltage levels of the drive voltage $V_{GS}$. Or the mapping circuit 65 may generate the reference signal $S_{REF}$ in accordance with curves as illustrated in FIG. 7.

Figure 16:
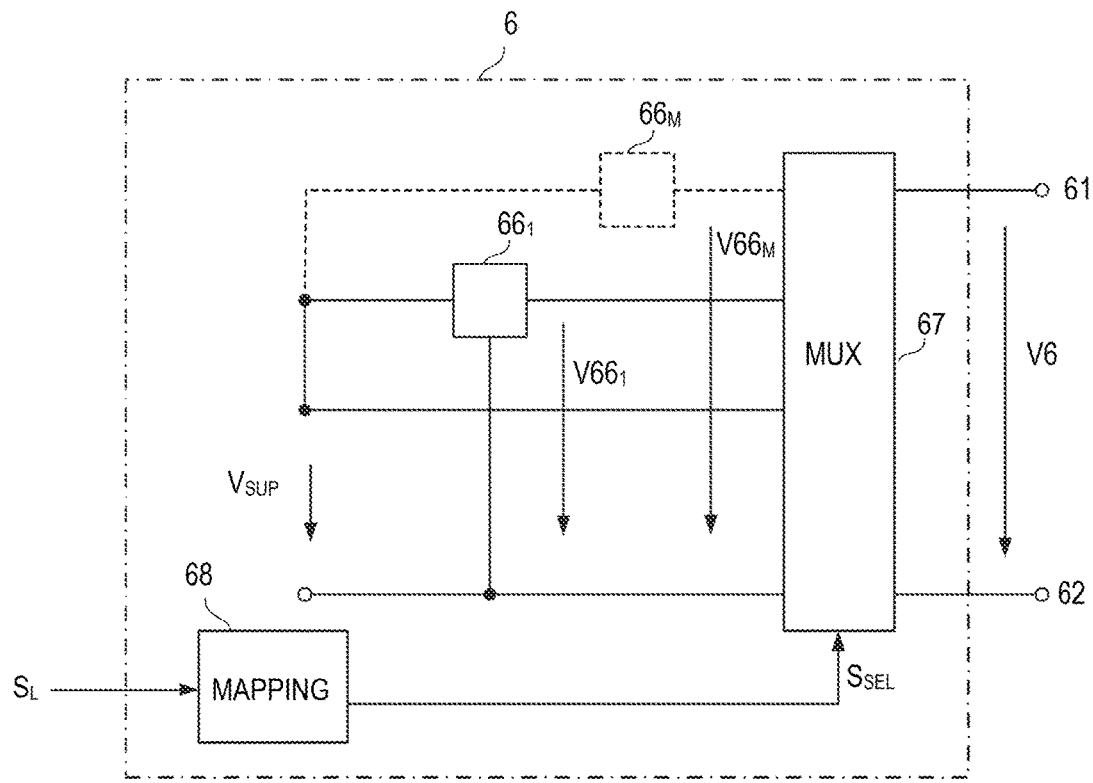
FIG. 16 shows another example of an adjustable voltage source.

FIG. 16 shows a first voltage source 6 according to another example. In this example, the voltage source 6 receives the supply voltage $V_{SUP}$ and includes at least one charge pump $66_1$, $66_M$. Just for the purpose of illustration, two charge pumps $66_1$, $66_M$ are shown in FIG. 1. Each of these charge pumps $66_1$, $66_M$ receives the supply voltage $V_{SUP}$ and generates an output voltage $V66_1$, $V66_M$ higher than the supply voltage $V_{SUP}$. A multiplexer 67 receives the supply voltage $V_{SUP}$ and the output voltage $V66_1$, $V66_M$ from each of the charge pumps $66_1$, $66_M$. The multiplexer 67 outputs one of the supply voltage $V_{SUP}$ and the output voltages $V66_1$, $V66_M$ of the charge pumps $66_1$, $66_M$ as the first voltage V6. A select signal $S_{SEL}$ defines which of the voltages received by the multiplexer 67 is to be output as the first voltage V6. This select signal $S_{SEL}$ is generated by a mapping circuit 68 based on the load signal $S_L$. The adjustable voltage source 6 shown in FIG. 16 can generate the first voltage V6 and, therefore, the drive voltage $V_{GS}$ in accordance with a drive scheme shown in FIG. 6 (with the difference being that FIG. 6 shows four different voltage levels, while the circuit shown in FIG. 16 can generate only three different voltage levels). The drive voltage $V_{GS}$ has the minimum level $V_{GS\_MIN}$ when the first voltage V6 equals the supply voltage $V_{SUP}$, the drive voltage $V_{GS}$ has the maximum level when the first voltage V6 equals the voltage $V66_M$, and the drive voltage $V_{GS}$ has a voltage level between the minimum level $V_{GS\_MIN}$ and a maximum level $V_{GS\_MAX}$ when the first voltage V6 equals the voltage $V66_1$.

Figure 17:
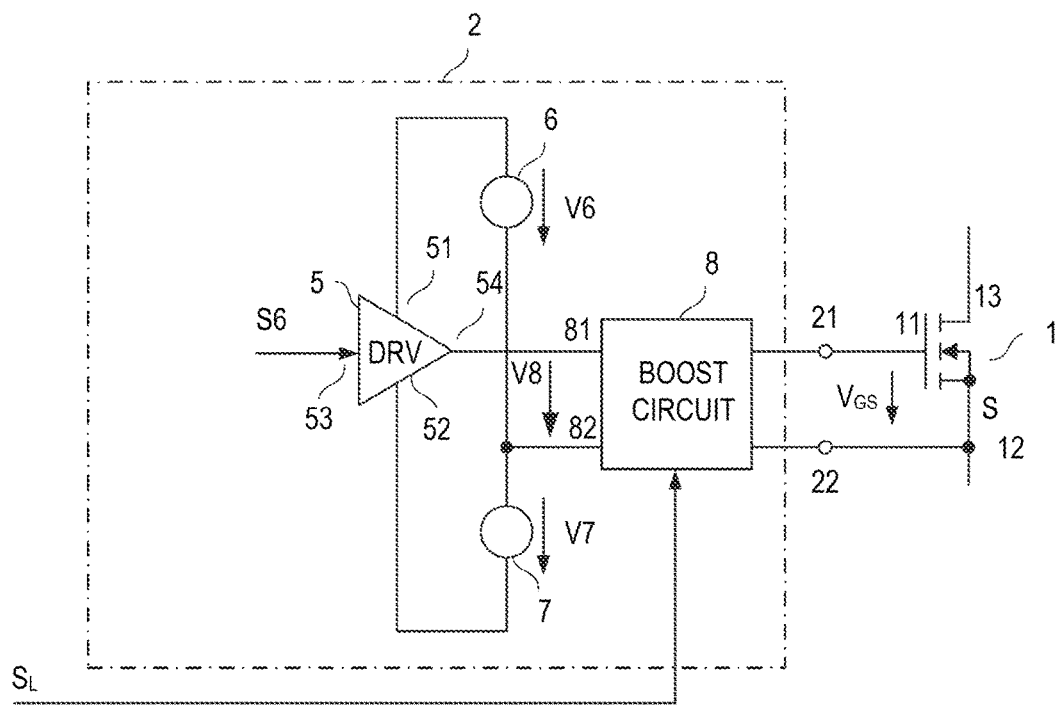
FIG. 17 shows a drive circuit with a boost circuit.

FIG. 17 shows a drive circuit 2 according to another example. In this example, the first voltage V6 provided by the first voltage source 6 is substantially constant. A boost circuit 8 connected between the output 54 of the driver 5 and the first and second output nodes 21, 22 is configured to adjust the drive voltage $V_{GS}$ based on the load signal $S_L$. This boost circuit 8 has a first input connected to the output 54 of the driver 5, and a second input 82 coupled to the second input 52 of the driver 5 via the second voltage source 7. In FIG. 17, V8 denotes a voltage between the first input node 81 and the second input node 82 of the boost circuit 8.

The boost circuit 8 is configured to generate the drive voltage $V_{GS}$ in two different ways. In a first operating mode, which is the operating mode in which the transistor device 1 is operated in the off-state, the boost circuit generates the drive voltage $V_{GS}$ such that it essentially equals the input voltage V8. The boost circuit 8 is in the first operating mode when the input voltage V8 is negative, that is, when the input voltage V8 equals −V7. In a second operating mode, which is the operating mode in which the transistor device 1 is operated in the on-state, the boost circuit generates the drive voltage $V_{GS}$ such that it is dependent on the input voltage V8 and dependent on the load signal $S_L$. The boost circuit 8 is in the second operating mode when the input voltage V8 is positive, that is, when the input voltage V8 equals the first voltage V6.

Figure 18:
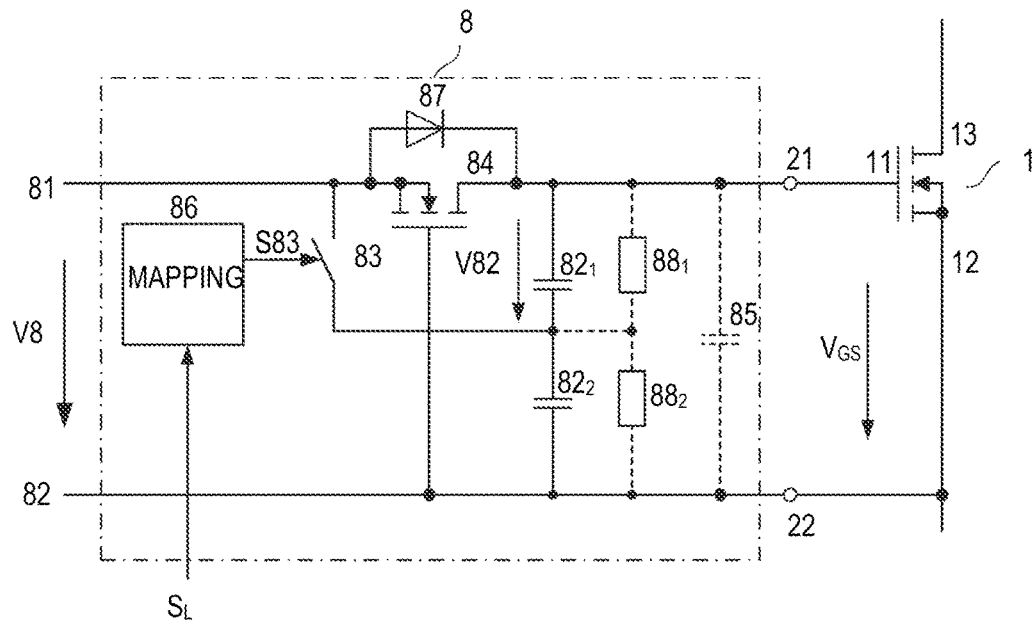
FIG. 18 shows one example of the boost circuit.

One example of the boost circuit 8 is shown in FIG. 18. In this example, the boost circuit 8 includes a capacitive voltage divider with a first capacitor $82_1$ and a second capacitor $82_2$ connected between the first output node 21 and the second output node 22. A capacitor 85 connected in parallel with the output nodes 21, 22 is optional. A load path of a transistor device 84 is connected between the first input node 81 of the boost circuit 8 and the first output node 21, and a control node of the transistor 84 is connected to the second input node 82 of the boost circuit 8 so that the transistor device 84 receives the input voltage V8 of the boost circuit 8 as a drive voltage. This transistor device 84 is configured such that it is an off-state when the input voltage V8 is positive. A rectifier element 87 is connected in parallel with the transistor device 84 and is connected such that it allows a current to flow from the input 81, 82 of the boost circuit 8 to the output 21, 22. According to one example, the transistor device 84 is MOSFET such as (as illustrated) an n-type enhancement MOSFET. In this case, a gate node of the MOSFET is connected to the second input node 82 and a source node of the MOSFET is connected to the first input node 81. A MOSFET may include an internal diode (usually referred to as body diode). The rectifier element 87 as shown in FIG. 18 can be the internal body diode of the MOSFET 84 or an additional diode connected in parallel with the load path of the MOSFET 84. If the diode 87 is an additional diode, it can be a bipolar diode or a Schottky diode.

Further, the boost circuit 8 includes an electronic switch 83 connected between the first input node 81 and a tap of the capacitive voltage divider $82_1$, $82_2$. A mapping circuit 86 drives the electronic switch 83 dependent on the load signal $S_L$.

Figure 19:
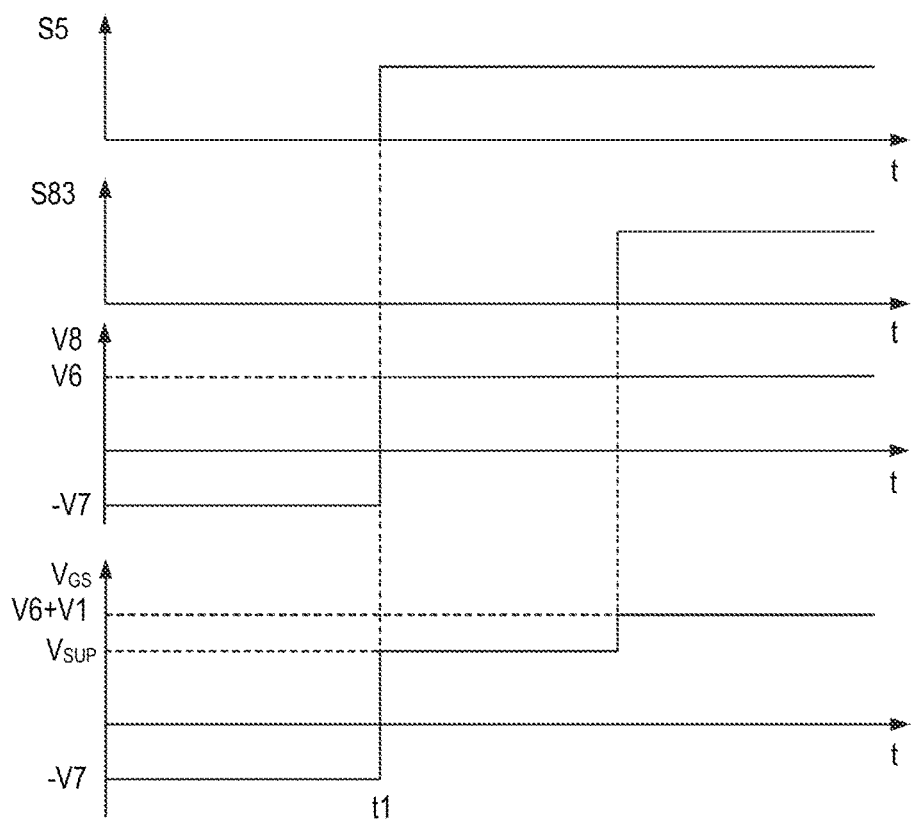
FIG. 19 shows timing diagrams that illustrate operation of the boost circuit shown in FIG. 18.

The function of the boost circuit 8 shown in FIG. 18 becomes apparent from FIG. 19 that shows timing diagrams of the drive signal S5 received by the driver 5, the control signal S83 generated by the mapping circuit 86, the input voltage V8 of the boost circuit and the drive voltage $V_{GS}$. When the drive signal S5 has a signal level indicating that it is desired to drive the transistor device 1 in the off-state, the driver 5 connects the second voltage source 7 between the input nodes 81, 82 of the boost circuit 8. Consequently, the input voltage V8 is the inverted second voltage −V7. In this operating state, the transistor device 84 is in the on-state, so that the drive voltage $V_{GS}$ substantially equals −V7. When the drive signal S5 indicate that it is desired to switch on the transistor device 1, the driver 5 connects the first voltage source 6 between the input nodes 81, 82 of the boost circuit 8, so that the input voltage V8 essentially equals the first voltage V6. This is shown at a first time instance t1 in FIG. 19. The transistor device 84 switches off when the voltage V8 increases to the first voltage V6. Via the rectifier element 87 the input voltage V8 is passed through to the output node 21, 22 so that the capacitor of the voltage divider $82_1$, $82_2$ are charged and the drive voltage essentially equals the first voltage V6. When the mapping circuit 84 switches on switch 83, the drive voltage is boosted from a first level (minimum level) represented by the first voltage V6 to a second level (maximum level). The boost circuit is therefore configured to drive the transistor device 1 with one of two different voltage levels. The second level is given by V6+V82, wherein V82 is the voltage across capacitor $82_1$ of the voltage divider. This voltage V82 is given by $$V82 = \frac{C2}{C1+C2} \cdot V6, \quad (2)$$

where C1 is the capacitance of capacitor $82_1$ and C2 is the capacitance of capacitor $82_2$.

Optionally, there may be at least one resistive element coupled to the capacitive voltage divider $82_1$, $82_2$ that causes the capacitive voltage divider $82_1$, $82_2$ to be discharged and the drive voltage $V_{GS}$ to decrease towards the input voltage V8 after the drive voltage $V_{GS}$ has been boosted (to V6+V1) by activating switch 83. In this case, activating the switch 83 causes the drive voltage $V_{GS}$ to rapidly increase (as shown in FIG. 19), wherein the at least one resistive element causes the drive voltage $V_{GS}$ to slowly decrease. According to one example, the at least one resistive element includes a first resistive element $88_1$ connected in parallel with the first capacitor $82_1$ and a second resistive element $88_2$ connected in parallel with the second capacitor $82_2$. According to one example, a resistance of the second resistive element $88_2$ is smaller than a resistance of the first resistive element $88_1$. According to one example, the resistance of the second resistive element $88_2$ is less than 10%, less than 5%, or less than 1% of the resistance of the first resistive element $88_1$ so that the second capacitor $82_2$ is discharged faster than the first capacitor $82_1$. According to one example, capacitances of the first capacitor $82_1$ and the second capacitor $82_2$ differ by less than 30% of the capacitance of the smaller one of the two capacitors $82_1$, $82_2$. If the level of the drive voltage $V_{GS}$ has decreased to the input voltage V8 by virtue of the at least on resistive element and the load signal $S_L$ indicates that it is still desired to drive the transistor device 1 with the higher voltage level, the mapping circuit may deactivate switch 83 for a certain time period in which the second capacitor $88_2$ is further discharged and then again activate the switch 83 to boost the drive voltage $V_{GS}$. Additionally or alternatively to the first and second resistive element $88_1$, $88_2$, a resistive element (not shown) is connected in parallel with the capacitive voltage divide $82_1$, $82_2$, that is, between the output nodes 21, 22.

The invention claimed is:

1. A method comprising:
    driving a transistor device in an on-state by applying a drive voltage having a voltage level higher than a threshold voltage level of the transistor device to a drive input;
    adjusting the voltage level of the drive voltage based on a load signal that represents a current level of a load current through the transistor device; and
    determining that the current level of the load current exceeds a threshold current level,
    wherein adjusting the voltage level of the drive voltage comprises increasing the voltage level of the drive voltage in the on-state causing a reduction in conduction losses in the transistor device in response to determining that the current level of the load current exceeds the threshold current level, and
    wherein the current level is an actual current level or an expected current level of the load current.

2. The method of claim 1, wherein adjusting the voltage level comprises selecting the voltage level from a voltage level range ranging from a minimum voltage level to a maximum voltage level.

3. The method of claim 2, wherein selecting the voltage level comprises selecting one of at least two discrete voltage levels.

4. The method of claim 2,
    wherein each of the minimum voltage level and the maximum voltage level is associated with a statistical lifetime of the transistor device, and
    wherein the statistical lifetime associated with the maximum voltage level is less than 10% of the statistical lifetime associated with the minimum voltage level.

5. The method of claim 4,
    wherein the statistical lifetime is associated with a failure rate, and
    wherein the failure rate associated with the lifetime is selected from between $10^{-1}$ and $10^{-6}$.

6. The method of claim 4, wherein the statistical lifetime associated with the minimum voltage level is greater than 10 years, greater than 50 years, or greater than 100 years.

7. The method of claim 2, wherein a difference between the maximum voltage level and the minimum voltage level is greater than 5V, greater than 10V or greater than 15V.

8. The method of claim 1, wherein the transistor device is selected from the group consisting of:
    a silicon (Si) MOSFET;
    a silicon carbide (SiC) MOSFET; and
    an IGBT.

9. The method of claim 1, wherein the transistor device has a voltage blocking capability higher than 400V, higher than 600V, or higher than 800V.

10. The method of claim 1, further comprising obtaining the load signal based on measuring at least one of the current through the transistor device or the voltage across a load path of the transistor device.

11. The method of claim 1, further comprising receiving the load signal from a load circuit connected to the transistor device.

12. The method of claim 1, wherein a load path of the transistor device is connected between a power source and a load circuit.

13. The method of claim 1, wherein driving the transistor device in the on-state comprises driving the transistor device in the on-state based on a control signal.

14. An electronic circuit comprising a drive circuit, wherein the drive circuit is configured to:
    generate a drive voltage at a drive output configured to have a drive input of the transistor device connected thereto, wherein a voltage level of the drive voltage is higher than a threshold voltage level of the transistor device;
    adjust the voltage level of the drive voltage based on a load signal that represents a current level of a load current through the transistor device; and determine that the current level of the load current exceeds a threshold current level, wherein the drive circuit is configured to adjust the voltage level of the drive voltage by increasing the voltage level of the drive voltage in the on-state causing a reduction in conduction losses in the transistor device in response to determining that the current level of the load current exceeds the threshold current level, and wherein the current level is an actual current level or an expected current level of the load current.

15. The electronic circuit of claim 14, further comprising the transistor device.

16. The electronic circuit of claim 14, wherein the drive circuit is configured to adjust the voltage level by selecting the voltage level from a voltage level range ranging from a minimum voltage level to a maximum voltage level.

17. The electronic circuit of claim 16, wherein each of the minimum voltage level and the maximum voltage level is associated with statistical lifetime of the transistor device, and wherein the statistical lifetime associated with the maximum voltage level is less than 10% of the statistical lifetime associated with the minimum voltage level.

18. The electronic circuit of claim 17, wherein the statistical lifetime is associated with a failure rate, and wherein the failure rate associated with the lifetime is selected from between $10^{-1}$ and $10^{-6}$.

19. The electronic circuit of claim 17, wherein the statistical lifetime associated with the minimum voltage level is greater than 10 years, greater than 50 years, or greater than 100 years.

20. The method of claim 1, wherein increasing the voltage level of the drive voltage in the on-state causes the reduction in the conduction losses comprises reducing an on-resistance of the transistor device.

* * * * *